US011251782B1

(12) United States Patent
Grad et al.

(10) Patent No.: US 11,251,782 B1
(45) Date of Patent: Feb. 15, 2022

(54) LEVEL SHIFTER WITH ESD PROTECTION

(71) Applicant: NXP B.V., San Jose, CA (US)

(72) Inventors: Marcin Grad, Bemmel (NL); Paul Hendrik Cappon, Wijchen (NL); Kiran B. Gopal, Bangalore (IN); Taede Smedes, Beuningen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/094,284

(22) Filed: Nov. 10, 2020

(51) Int. Cl.
*H03K 3/356* (2006.01)
*H01L 27/02* (2006.01)
*H03K 19/0185* (2006.01)

(52) U.S. Cl.
CPC .... *H03K 3/356113* (2013.01); *H01L 27/0248* (2013.01); *H03K 3/356182* (2013.01); *H03K 19/018528* (2013.01)

(58) Field of Classification Search
None
See application file for complete search history.

(56) References Cited

U.S. PATENT DOCUMENTS

| 7,609,090 | B2* | 10/2009 | Srivastava | H03K 3/012 326/68 |
| 8,009,397 | B2* | 8/2011 | Etherton | G11C 17/18 361/56 |
| 9,692,229 | B2* | 6/2017 | Kunz, Jr. | H02H 9/046 |
| 10,734,806 | B2* | 8/2020 | Zhao | H02H 9/046 |
| 2004/0207450 | A1* | 10/2004 | Ando | H03K 3/35613 327/333 |
| 2015/0194418 | A1* | 7/2015 | Bade | H02H 9/046 361/56 |
| 2018/0047720 | A1* | 2/2018 | Lai | H02H 9/045 |
| 2018/0301898 | A1* | 10/2018 | Hsu | H01L 27/0285 |
| 2019/0260203 | A1* | 8/2019 | Seidl | H01L 27/0274 |

FOREIGN PATENT DOCUMENTS

TW    I360297 B    3/2012

OTHER PUBLICATIONS

Chen, S., "Active ESD Protection Design for Interface Circuits Between Separated Power Domains Against Cross-Power-Domain ESD Stresses", IEEE Transactions on Device and Materials Reliability, vol. 8, No. 3, Sep. 2008.

(Continued)

*Primary Examiner* — Lincoln D Donovan
*Assistant Examiner* — Khareem E Almo
(74) *Attorney, Agent, or Firm* — David G. Dolezal

(57) ABSTRACT

As disclosed herein, a level shift circuit includes devices that are responsive to an ESD signal for placing those devices in a specific condition in response to the ESD signal indicating an ESD event. In some embodiments, the devices are transistors in current paths that are placed in a condition such that during an ESD event, voltage differentials in the current paths across voltage domain boundaries do not damage the circuitry of the level shift circuit. In some embodiments, some of the same devices that are responsive to the ESD event are also responsive to a signal to that detects the absence of a power supply voltage of one of the domains and places those devices in a condition to disable the level shift circuit if the power supply voltage is not present.

20 Claims, 4 Drawing Sheets

(56) References Cited

OTHER PUBLICATIONS

Kitagawa, N., "An Active ESD Protection Technique for the Power Domain Boundary in a Deep Submicron IC", 2006 Electrical Overstress/Electrostatic Discharge Symposium, Sep. 10-15, 2006.
Narita, K., "CDM Protection Design using Internal Power Node for Cross Power Domain in 16nm CMOS Technology", 38th Electrical Overstress/Electrostatic Discharge Symposium (EOS/ESD), Sep. 11-16, 2016.
Suzuki, T., "A Study of ESD Robustness of Cascoded NMOS Driver", 29th Electrical Overstress/Electrostatic Discharge Symposium, Sep. 16-21, 2007.

* cited by examiner

LEVEL SHIFTER WITH ESD PROTECTION

BACKGROUND OF THE INVENTION

Field of the Invention

This invention relates to level shifters with ESD protection.

Background

Level shifters are utilized to transfer signals from circuitry of one voltage domain to circuitry of another voltage domain.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a level shift circuit includes devices that are responsive to an ESD signal for placing those devices in a specific condition in response to the ESD signal indicating an ESD event. In some embodiments, the devices are transistors in current paths that are placed in a condition such that during an ESD event, voltage differentials in the current paths across voltage domain boundaries do not damage the circuitry of the level shift circuit. In some embodiments, some of the same devices that are responsive to the ESD event are also responsive to a signal to that detects the absence of a power supply voltage of one of the domains and places those devices in a condition to disable the level shift circuit if the power supply voltage is not present.

In designs that have high power supply voltages and ground isolation, level shifters are a commonly applied solution to translate voltage levels between different voltage domains. During normal operation, level shifters are designed to fulfill timing and noise level requirements, which may be very challenging for high-speed applications.

Figure 1:
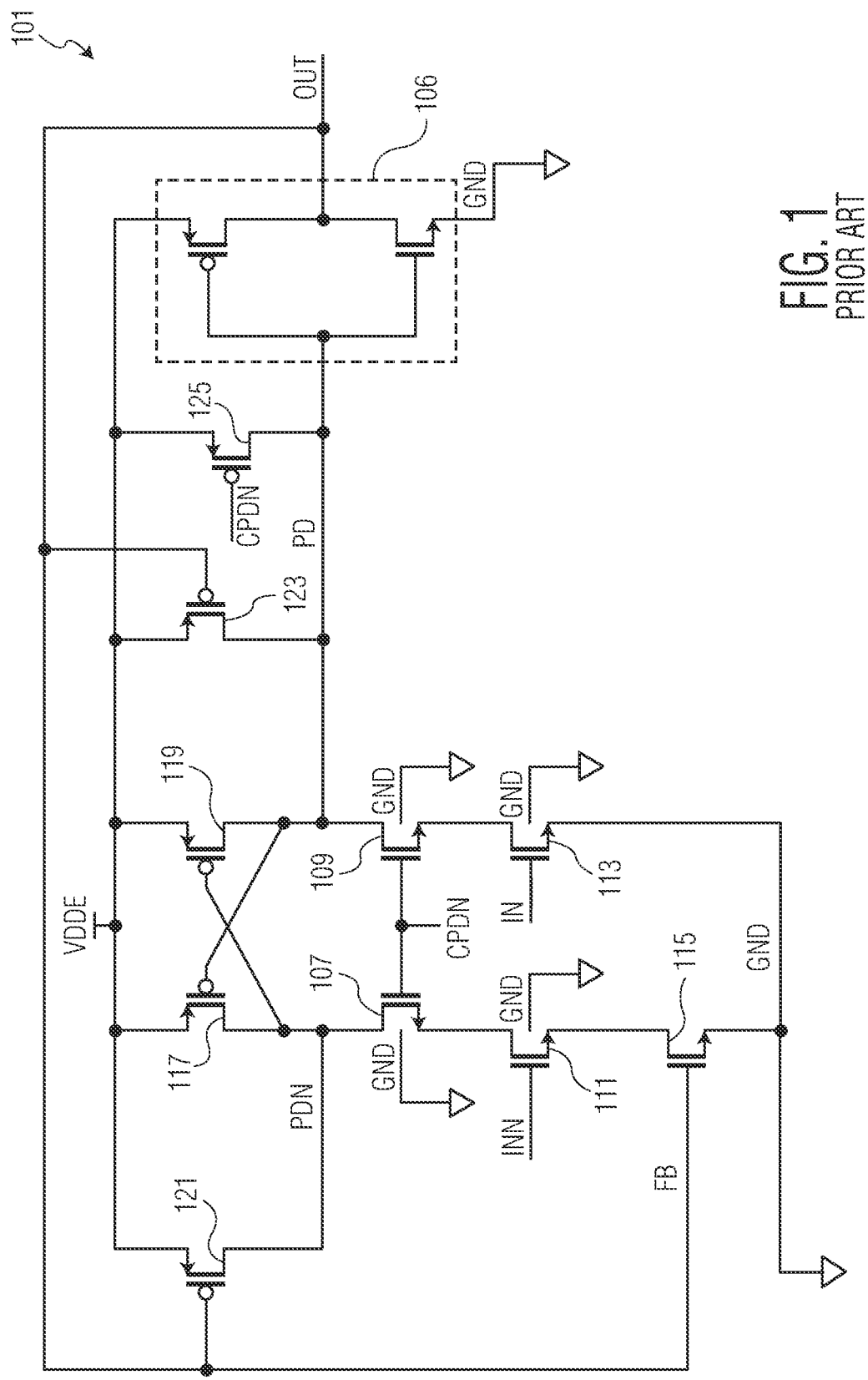
FIG. 1 is a circuit diagram of a prior art level shifter circuit.

FIG. 1 is an example of a prior art level shift circuit 101. Circuit 101 includes input NFET transistors 111 and 113, NFET transistors 115, 107, and 109, and PFET transistors 121, 117, 119, 123, and 125. Circuit 101 also includes an inverter 106, which includes an NFET transistor and a PFET transistor. Level shift circuit 101 receives complementary IN and INN signals from a one voltage domain (not shown) and provides a level shifted OUT signal to a second voltage domain (having a high power supply voltage of VDDE). Transistors 107, 109, and 125 are responsive to a CPDN signal. When the CPDN signal is high indicating that a power supply voltage of voltage domain providing the IN signal is present, transistors 107 and 109 are conductive and transistor 125 is nonconductive. When the CPDN signal is low indicating that the power supply voltage of voltage domain providing the IN signal is absent, transistors 107 and 109 are placed in a nonconductive state and transistor 125 is placed in a conductive state. GND is the low level power supply voltage for the voltage domain providing the IN and INN signals and VDDE is the high level power supply voltage for the voltage domain receiving the OUT signal.

Since level shifters are circuits placed at domain boundaries, they may be exposed to voltage overstress during an ESD event, especially in which voltages on domain crossings may significantly exceed breakdown voltages of the implemented devices. Commonly used solutions for limiting stress on a level shifter include implementing local ESD clamps to limit the voltages seen by the devices at domain crossings. However, such clamps may limit the normal operating performance as they typically comprise a resistance and (in most cases) a voltage triggered component that can act as a capacitive load. The clamps located on a signal path may introduce a delay and affect signal timing. As described herein, having at least one device of the level shifter responsive to an ESD signal for placing the device in a known state during an ESD event may reduce the excessive voltages on a level shifter during an ESD event without having to have clamps on the signal path.

Figure 2:
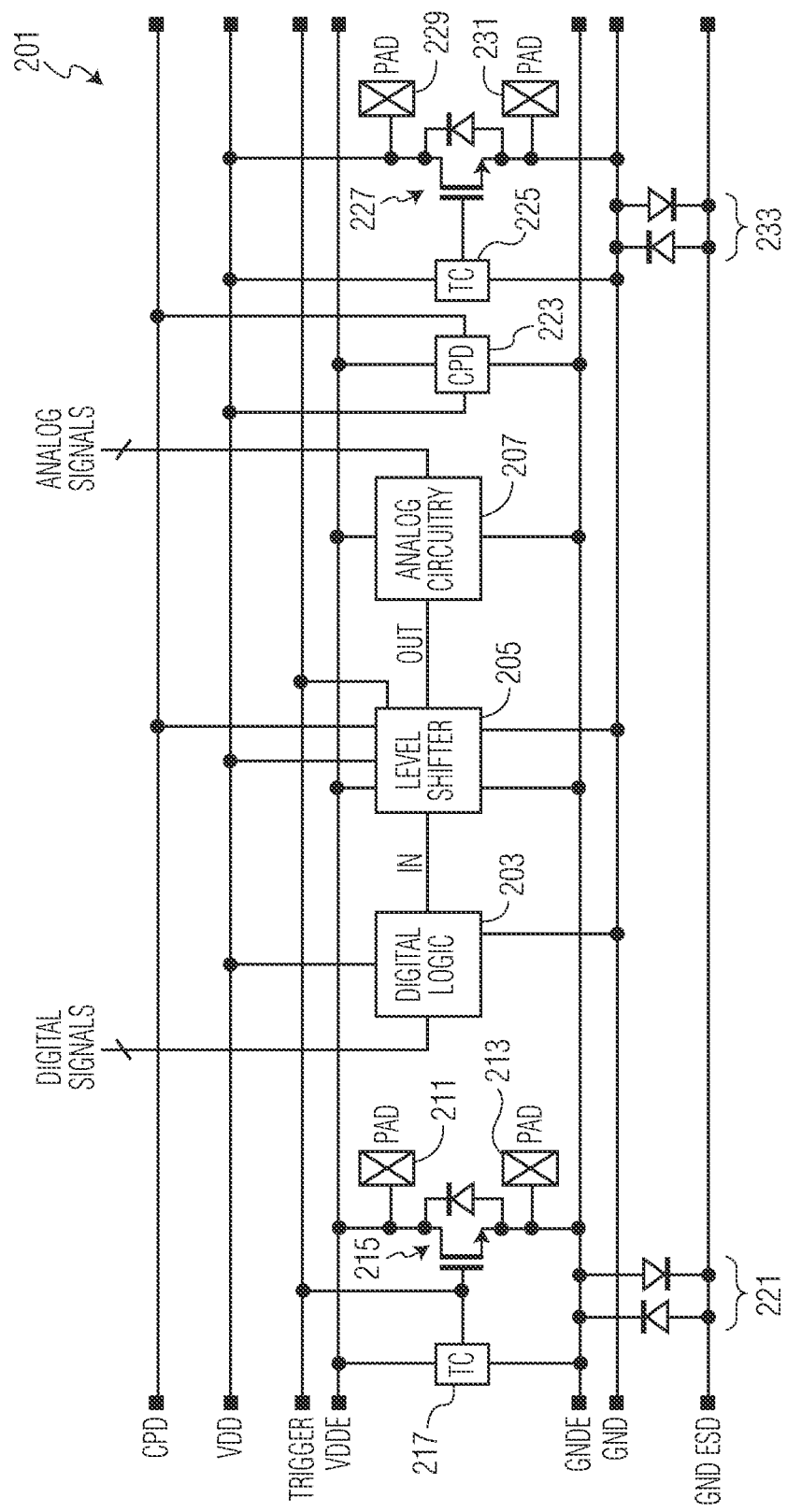
FIG. 2 is a circuit diagram of a circuit according to one embodiment of the present invention.

FIG. 2 is a circuit diagram of a circuit 201 according to one embodiment of the present invention. Circuit 201 includes two voltage domains. In the embodiment shown, digital logic 203 is located in one voltage domain which receives a high power supply voltage of VDD from pad 229 and a low power supply voltage of GND from pad 231 (hereafter referred to as the VDD voltage domain). Analog circuitry 207 is located in the other voltage domain that receives a high power supply voltage of VDDE from pad 211 and low power supply voltage of GNDE from pad 213 (hereafter referred to as the VDDE voltage domain). Digital logic 203 may include circuits such as processing circuitry, memories, logic gates, and hardware accelerators. Analog circuitry 207 may include I/O circuitry, sensors, high voltage switches, and gate drivers. In other embodiments, the voltage domains may include other circuitry. For example, voltage domain VDD may include analogy circuitry (not shown) and/or voltage domain VDDE may include digital circuitry (not shown). In one embodiment, VDD is set at 0.9 volts and VDDE is set at 1.8 volts, but these voltages may vary in other embodiments.

In one embodiment, circuit 201 is implemented as an integrated circuit where pads 211, 213, 229, and 231 are external terminals of the integrate circuit. The integrated circuit may include other power pads and include signal pads (not shown). The integrated circuit may be packaged in an encapsulant (e.g. molding compound, resin) by itself or with other integrated circuits to form an integrated circuit package that is implemented in electronic systems. In such a package, pads (211, 213, 229, and 231) would be electrically coupled to external terminals (e.g. pads, pins, leads, bumps) of the integrated circuit package.

Circuit 201 includes a voltage detection circuit 223 that is coupled to both pads 211 and 229 to detect whether each power supply voltage is present at each pad and provide a signal (CPD) indicative of an absence of either one. In some embodiments, circuit 223 would only detect the presence of one of the power supply voltages (VDD and VDDE).

Circuit 201 includes electrostatic discharge (ESD) circuitry for protecting the devices of circuit 201 from an ESD event. An ESD event may occur when a charged object (e.g. a human finger) inadvertently contacts a conductive surface of a circuit (e.g. a contact pad (211) or a conductive surface of an integrated circuit package coupled to the pad) where charge at an elevated voltage is applied to the conductive surface due to the contact. Being at an elevated voltage, such charge may cause voltage differentials across the devices of circuit 201 that may exceed their safe operating areas and damage those devices. An ESD event may also occur when a charged conductive surface of a circuit contacts an external object where charge is transferred between the conductive surface and the external object.

In the embodiment shown, trigger circuit 217 detects an ESD event at pad 211 by detecting an elevated voltage at pad 211. An ESD event at a pad may be where the pad is inadvertently contacted by an object of a different potential or a conductive surface electrically coupled to the pad (e.g. a package external terminal) is inadvertently contacted by an object of a different potential. In response to an ESD event at pad 211 or related pads, circuit 217 asserts a TRIGGER signal which activates ESD clamp 215 to couple pad 211 to pad 213 to discharge the current from the ESD event to pad 213. Trigger circuit 225 detects an ESD event at pad 229 or related pads. In response to an ESD event, trigger circuit 225 activates clamp 227 to discharge the charge from the ESD event from pad 229 to pad 231. In the embodiment shown, clamps 215 and 227 each include an NFET transistor and a diode. However, other types of ESD clamps may be used in other embodiments.

Circuit 201 includes a pair of diodes 221 for coupling GNDE pad 213 to the system ground rail (GND ESD) and a pair of diodes 233 for coupling GND pad 231 to the system ground rail (GND ESD). If the voltage level of either GNDE or GND rises during an ESD event, the pairs of diodes act to conduct the ESD currents and limit the voltage differentials.

Circuit 201 includes a level shift circuit 205 for shifting a signal (IN) provided by digital logic circuit 203 to provide the OUT signal to analog circuitry 207. The voltage range of the IN signal is from GND to VDD and the voltage range of the OUT signal is from GNDE to VDDE. In the embodiment shown GND is at the same voltage as GNDE, although they may be at different voltages in other embodiments. Level shift circuit 205 is coupled to the VDDE, VDD, GNDE, and GND pads. It also receives the TRIGGER signal and the CPD signal.

Circuit 201 may have other configurations in other embodiments. In some embodiments, circuit 201 may have multiple level shifters including one for each signal provided between the VDD voltage domain and the VDDE voltage domain. Also, circuit 201, may include other voltage domains as well.

Figure 3:
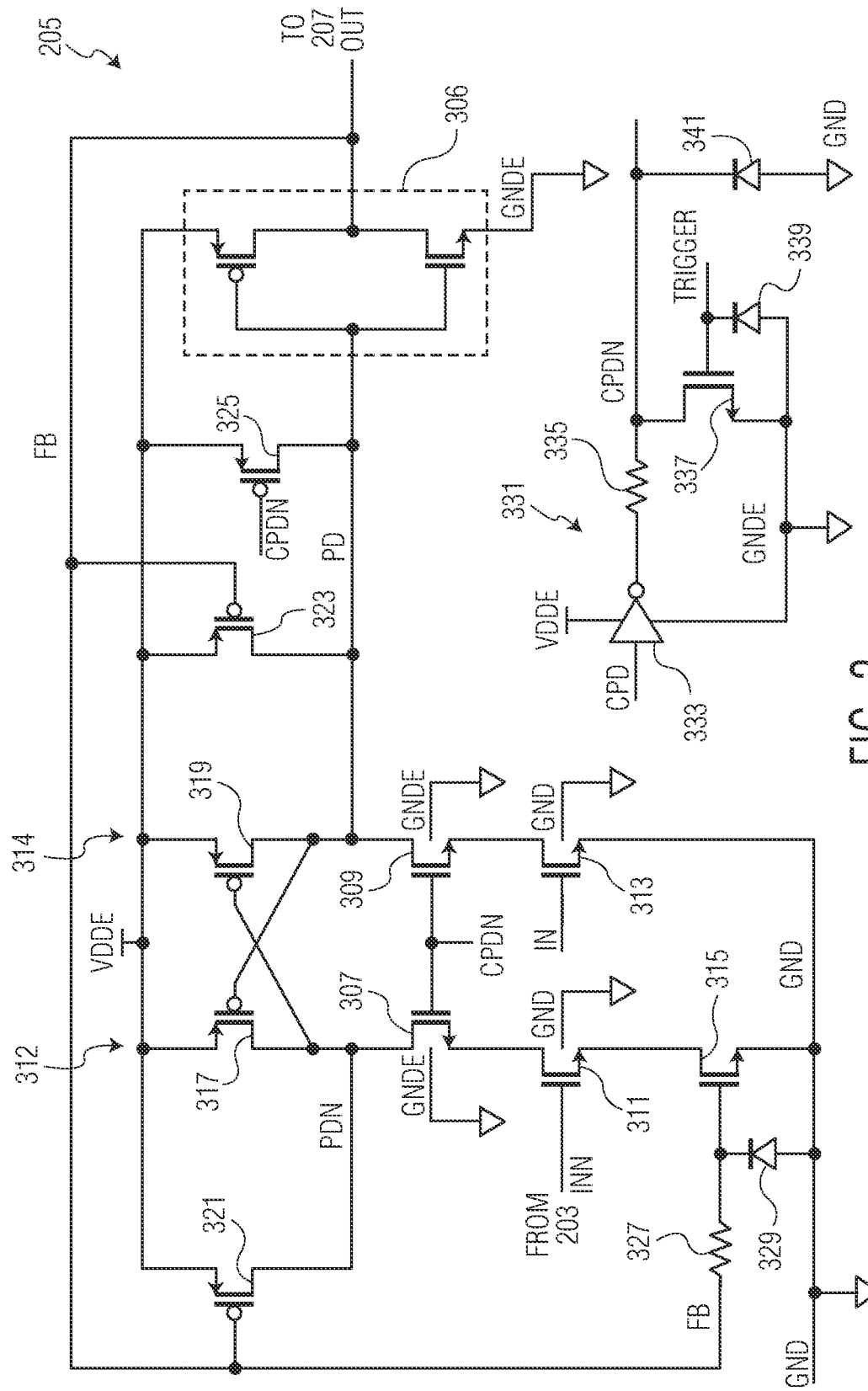
FIG. 3 is a circuit diagram of a level shift circuit according to one embodiment of the present invention.

FIG. 3 is a circuit diagram of level shifter 205 according to one embodiment of the present invention. Level shift circuit 205 includes two input NFET transistors 311 and 313. Transistor 313 includes a gate (a control terminal for a FET) that receives the IN signal and transistor 311 includes a gate that receives the INN signal, which is a complementary signal to the IN signal. Transistor 311 is located in a current path 312 which includes isolation NFET transistor 307 and PFET transistor 317, as well as a feedback NFET transistor 315. Input transistor 313 is located in a current path 314 that includes isolation NFET transistor 309 an PFET transistor 319. Current path 312 includes node PDN, which provides a voltage that is inverse to the INN signal and that is shifted to voltage domain VDDE. Current path 314 includes node PD which provides a signal that is inverse to the IN signal and that is shifted to voltage domain VDDE. Thus, the signals on nodes PD and PDN are complimentary to each other. Circuit 205 includes an inverter 306 that inverts the signal on node PD as the OUT signal. Level shift circuit is characterized as a differential level shifter.

Circuit 205 also includes keeper PFET transistor 321 and keeper PFET transistor 323 that are responsive to the OUT signal to latch nodes PDN and PD respectively, at VDDE when the OUT signal is at a low voltage value (GNDE). Transistors 321 and 323 are comparatively weaker than transistors 311, 313, 317, and 319. Circuit 205 also includes a feedback footer transistor 315 for pulling the source of transistor 311 to GND to when the OUT signal is high. A resistor 327 and diode 329 are connected to the gate of transistor 315 to prevent damage to transistor 315 due to an ESD event on pad 211. Transistor 315 prevents a continuous current from VDDE to GND through transistors 321, 307 and 311 once the OUT signal is at a low voltage level (GNDE).

Transistors 307 and 309 are used as isolation transistors that are made nonconductive if a high power supply voltage (either VDD or VDDE) is absent as indicated by the CPD signal from CPD circuit 223 (See FIG. 2). Also, transistor 325 is made conductive to pull node PD to VDDE, and thus pull the OUT signal to GNDE to place the OUT signal in a known state if one of the high power supply voltages is not present.

During operation, when the IN signal is high, transistor 313 becomes conductive to pull node PD (through a conductive transistor 309) to GND thereby overcoming weaker conductive transistor 323. PD being at ground makes transistor 317 conductive to pull node PDN harder to VDDE. Also, the INN signal being low makes transistor 311 nonconductive. When PD is at GNDE, the output of invertor (OUT) is pulled to VDDE. The OUT signal being at VDDE makes transistor 315 conductive to pull the source of transistor 311 to GND. With the OUT signal being at VDDE, transistors 321 and 323 are nonconductive.

When the INN signal goes high (VDD), transistor 311 becomes conductive to pull node PDN (through a conductive transistor 307) to GND. PDN being at ground makes transistor 319 conductive to pull node PD to VDDE. Node PD at VDDE pulls the OUT signal to GNDE. The OUT signal at GNDE makes transistors 321 and 323 conductive wherein transistor 323 latches node PD at VDDE and transistor 321 pulls node PDN to VDDE. At this time, the OUT signal going to GNDE makes transistor 315 nonconductive wherein node PDN is no longer pulled to GND by a conductive transistor 311.

Level shift circuit 205 includes nodes that are coupled to the power supply voltage terminals of both voltage domains. For example, the sources of transistors 321, 317, 319, 323, and 325, and inverter 306 are coupled to the VDDE terminal. The sources of transistors 315 and 313, and the body terminals of transistors 311 and 313 are tied to the GND terminal. The body terminals of transistors 307 and 309 and inverter 306 are tied to the GNDE terminal. As such a domain boundary exists between the VDD voltage domain and the VDDE voltage domain between transistors 307 and 311 and between transistors 309 and 313. An ESD event on the VDDE terminal (PAD 211) may cause a relatively large voltage drop from VDDE to GND.

In the embodiment shown, level shifter 205 includes a combining circuit 331 that produces a signal CPDN that is responsive to both the CPD signal indicative of an absence of a power supply voltage and the ESD signal (TRIGGER) indicative of an ESD event on pad 211 as provided by trigger circuit 217 (see FIG. 2). Circuit 331 includes an inverter 333 that is located in the VDDE voltage domain that inverts the CPD signal. Circuit 331 includes an NFET transistor 337 and pulls down the output of the CPDN signal in response to an ESD event as indicated by the TRIGGER signal. Circuit 331 includes a resistor 335 that provides a voltage drop if transistor 337 is conductive when the output of inverter 333 is high. Circuit 331 includes a diode 339 that is used as an ESD clamp. Also, circuit 331 also includes an ESD clamp coupled to the CPDN signal line which in the embodiment shown is implemented as a diode 341 whose anode is connected to GND terminal. In other embodiments, the combining circuit may have other configurations.

If both power supply voltages are present and there is no ESD event, the CPD signal and ESD signal are at a low voltage and the CPDN signal is at a high voltage of VDDE. The CPDN signal being at VDDE cause transistors 307 and 309 to be conductive and transistor 325 to be nonconductive allowing for circuit 205 to level shift the IN and INN signals as the OUT signal.

If an ESD event on VDDE pad 211 occurs, trigger circuit 217 activates the TRIGGER signal which pulls the CPDN signal to GNDE. The CPDN signal being pulled to GNDE causes transistors 307 and 309 to be nonconductive wherein current is inhibited from flowing though current paths 312 and 314. Also, when the CPDN signal is pulled to GNDE, node PD is pulled to VDDE by a conductive transistor 325, which causes the OUT signal to be pulled to GNDE by inverter 306. The OUT signal being pulled to GNDE causes transistor 321 to become conductive which pulls node PDN to VDDE as well.

Figure 4:
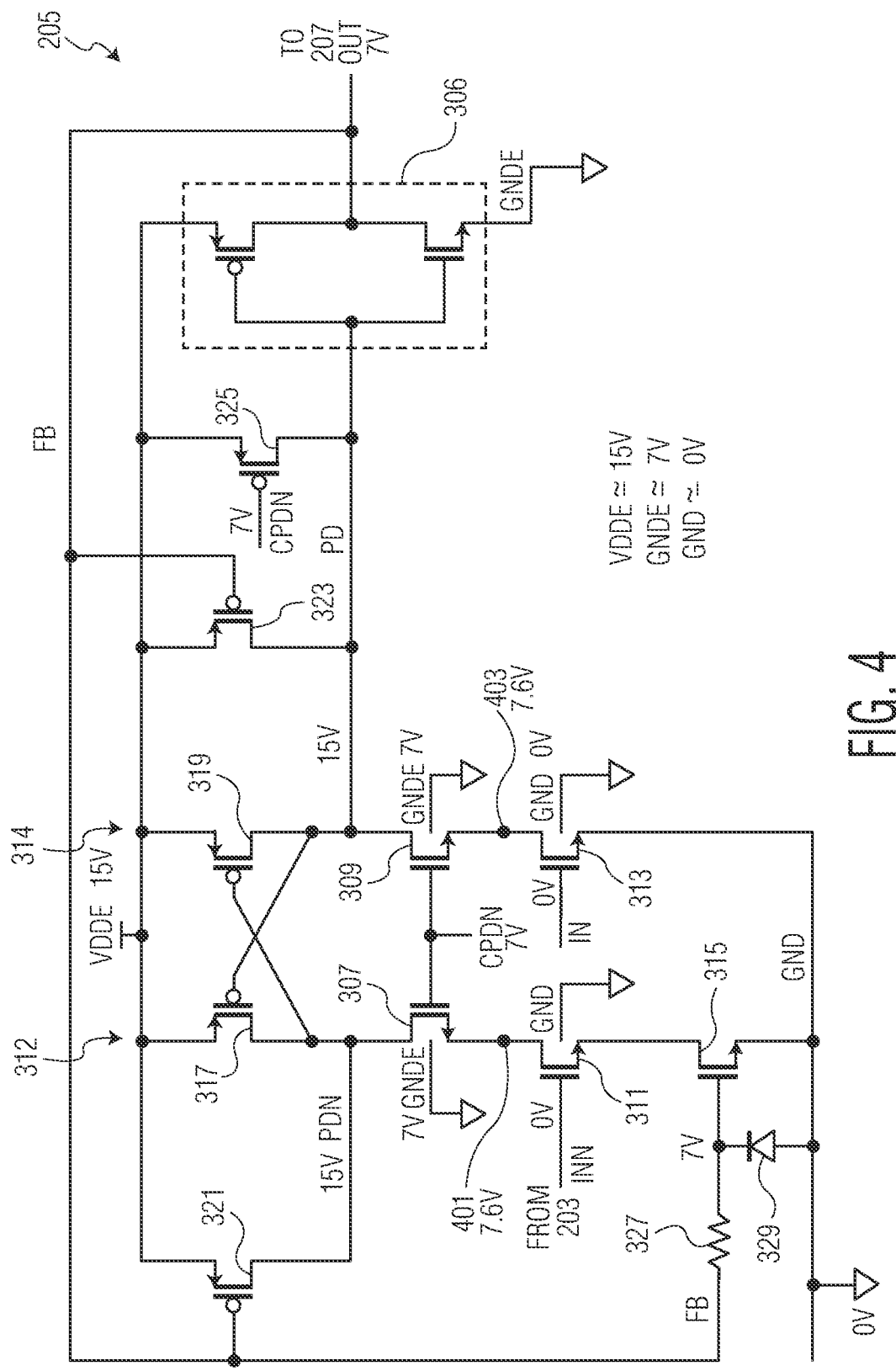
FIG. 4 is a circuit diagram of a level shift circuit showing the voltages at the nodes of the circuit during an ESD event according to one embodiment of the present invention.

FIG. 4 shows an example voltages of the nodes of level shift circuit 205 during a simulated ESD event on VDDE pad 211 with respect to GND pad 231. Not shown in FIG. 4 is combining circuit 331. The voltages presented in FIG. 4 are based on a simulated ESD event and may not reflect actual voltages present during a real life ESD event due to device model limitations. During the simulated ESD event shown, the voltage at VDDE pad 211 rises to approximately 15V, the voltage of GNDE pad 213 is pulled to 7 volts, and the voltage of GND pad is at 0 Volts. Under these conditions, the voltage of the CPDN signal will be 7 volts (the voltage of GNDE) which causes transistors 307 and 309 to become nonconductive. Also, transistor 325 will be made conductive to pull node PD to 15V (VDDE) which will pull the OUT signal to 7V (GNDE). The OUT signal being at 7V will make transistors 321 and 323 conductive where transistor 321 being conductive pulls node PDN to 15 V (VDDE). Also, the gate of transistor 315 is at 7 volts which makes transistor 315 conductive. During the simulated ESD event at pad 211, the voltages of the IN signal and the INN signal are low, wherein transistors 311 and 313 are nonconductive.

Based on these conditions set forth above, the voltage at the node 401 between transistor 307 and 311 and the voltage at node 403 between transistor 309 and 313 are each approximately 7.6 volts. The voltages at these nodes is limited by transistors 307 and 309 being made nonconductive by the CPDN signal being pulled to GNDE (7V). Accordingly, a portion of the voltage drop (approximately 7.4 volts) of the 15 volts at nodes PD and PDN to GND (0V) is dropped across nonconductive transistors 307 and 309. Because the voltage at nodes 401 and 403 is 7.6 volts, the voltage drop across transistors 311 and 313 is limited to 7.6 volts instead of 15 volts if transistors 307 and 309 were conductive at this time.

As shown in the example of FIG. 4, because transistors 307 and 309 were made nonconductive during the simulated ESD event on pad 211, no transistor has a voltage drop of more than 8 volts across any of their terminals. Accordingly, in this embodiment during a simulated ESD event, all of the transistors of circuit 205 are placed in conditions where the voltages across the transistors are in a safe operating area, thereby preventing damages to those devices. If transistors 307 and 309 where conductive, the 15 volt drop across transistors 311 and 313 from an ESD event may damage those transistors.

As shown herein, including a level shift circuit with at least one device that is responsive to an ESD signal allows for a level shift circuit that can limit the voltage drop from excessive voltage supply differentials (e.g. VDDE to GND) at domain boundaries (e.g. at nodes 401 and 403) due to an ESD event. In some embodiments, including a combining circuit that combines the ESD signal with a detection signal where the devices are responsive to both signals, allows for a reduction in devices of the level shifter.

In some embodiments, such a configuration may avoid having to have ESD clamps connected to nodes of the signal path of the level shifter. For example, in FIG. 3, there are no ESD clamps on current paths 312 and 314 or nodes PD or PDN. Accordingly, such a circuit may have a reduced parasitic capacitances and resistances and thereby have faster response times.

Other embodiments may include other devices and/or have other configurations. For example, in some embodiments, transistors 307, 309, and 325 would not be responsive to a detection signal (CPD). Also, in other embodiments, the level shifter would have greater or lesser number of transistors. For example, some level shift circuits may not include a feedback (FB) signal or transistors 321, 323, 325, or 315. Also, in some embodiments, a level shifter would include only one current path. Also, in other embodiments, a level shifter would produce a differential output signal (including a signal produced at node PDN as well).

The circuitry, features, and/or methods described with respect to one embodiment may be implemented with the circuitry, features, and/or methods of the other embodiments. A source and a drain are current terminals of a FET. A gate is a control terminal of a FET.

In one embodiment, a circuit includes first voltage domain circuitry. The first voltage domain circuitry is configured to provide a first signal. The circuit includes second voltage domain circuitry and an ESD detection circuit. The ESD detection circuit is configured to provide an ESD signal indicative of an ESD event. The circuit includes a level shift circuit. The level shift circuit includes an input to receive the first signal and an output to provide a second signal which is the first signal shifted for a voltage domain of the second voltage domain circuitry. The level shift circuit includes a current path including an input transistor whose control terminal receives the first signal and a node that provides a signal in a voltage domain of the second voltage domain circuitry that is inverse to the first signal. The level shift circuit includes an isolation transistor located in the current path between the input transistor and the node. A control terminal of the isolation transistor is responsive to the ESD signal such that the isolation transistor becomes nonconductive in response to the ESD signal indicating an ESD event.

In another embodiment, a circuit includes first voltage domain circuitry. The first voltage domain circuitry is configured to provide a first signal. The circuit includes second voltage domain circuitry. The circuit includes a voltage detection circuit. The voltage detection circuit configured to provide a detection signal indicative of an absence of a power supply voltage. The circuit includes an ESD detection circuit. The ESD detection circuit is configured to provide an ESD signal indicative of an ESD event. The circuit includes a level shift circuit. The level shift circuit including an input to receive the first signal and an output to provide a second signal which is the first signal shifted for a voltage domain of the second voltage domain circuitry. The level shift circuit includes a control node and at least one device responsive to the control node. The at least one device is responsive to the detection signal via the control node and the at least one device is responsive to the ESD signal indicating an ESD event via the control node.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit, comprising:
    first voltage domain circuitry, the first voltage domain circuitry configured to provide a first signal;
    second voltage domain circuitry;
    an ESD detection circuit, the ESD detection circuit configured to provide an ESD signal indicative of an ESD event;
    a level shift circuit, the level shift circuit including an input to receive the first signal and an output to provide a second signal which is the first signal shifted for a voltage domain of the second voltage domain circuitry, wherein the level shift circuit includes a current path including an input transistor whose control terminal receives the first signal and a node that provides a signal in a voltage domain of the second voltage domain circuitry that is inverse to the first signal, wherein the level shift circuit includes an isolation transistor located in the current path between the input transistor and the node, wherein a control terminal of the isolation transistor is responsive to the ESD signal such that the isolation transistor becomes nonconductive in response to the ESD signal indicating an ESD event.

2. The circuit of claim 1 wherein the level shift circuit includes a second current path including a second input transistor whose control terminal receives a signal complementary to the first signal and a second node that provides a signal in the voltage domain of the second voltage domain circuitry that is inverse to the complementary signal, wherein the level shift circuitry includes a second isolation transistor located in the second current path between the second input transistor and the second node, wherein a control terminal of the second isolation transistor is responsive to the ESD signal such that the second isolation transistor becomes nonconductive in response to the ESD signal indicating an ESD event.

3. The circuit of claim 1 wherein the level shift circuit includes a latch transistor coupled between the node and a power supply voltage terminal of the second voltage domain circuitry, wherein a control terminal of the latch transistor is responsive to the ESD signal to make the latch transistor conductive to pull the voltage of the node to the voltage of the power supply voltage terminal in response to the ESD signal indicating an ESD event.

4. The circuit of claim 1 further comprising:
    a voltage detection circuit, the voltage detection circuit providing a detection signal indicative of an absence of a power supply voltage;
    wherein the control terminal of the isolation transistor is responsive to the detection signal such that the isolation transistor becomes nonconductive in response to the detection signal indicating that the power supply voltage is absent.

5. The circuit of claim 1 wherein a body terminal of the input transistor is coupled to a power supply voltage terminal of the first domain circuitry and a body terminal of the isolation transistor is coupled to a power supply voltage terminal of the second domain circuitry.

6. The circuit of claim 1 wherein the current path extends from a power supply voltage terminal of the second domain circuitry to a power supply voltage terminal of the first domain circuitry.

7. A circuit, comprising:
    first voltage domain circuitry, the first voltage domain circuitry configured to provide a first signal;
    second voltage domain circuitry;
    a voltage detection circuit, the voltage detection circuit configured to provide a detection signal indicative of an absence of a power supply voltage;
    an ESD detection circuit, the ESD detection circuit configured to provide an ESD signal indicative of an ESD event;
    a level shift circuit, the level shift circuit including an input to receive the first signal and an output to provide a second signal which is the first signal shifted for a voltage domain of the second voltage domain circuitry, wherein the level shift circuit includes a control node and at least one device responsive to the control node, wherein the at least one device is responsive to the detection signal via the control node and the at least one device is responsive to the ESD signal indicating an ESD event via the control node.

8. The circuit of claim 7 wherein the level shift circuit includes a current path including an input transistor whose control terminal receives the first signal and a first circuit node that provides a signal in the voltage domain of the second voltage domain circuitry that is inverse to the first signal, wherein the at least one device includes a transistor located in the current path between the input transistor and the first circuit node, wherein a control terminal of the transistor is coupled to the control node.

9. The circuit of claim 8 wherein the output signal is inverse to the signal provided by the first circuit node.

10. The circuit of claim 8 wherein the level shift circuit includes a second current path including a second input transistor whose control terminal receives a complementary signal to the first signal received by the input transistor, the second current path includes a second circuit node that provides a signal in the voltage domain of the second voltage domain circuitry that is inverse to the complementary signal, wherein the at least one device includes a second transistor located in the second current path between the second input transistor and the second circuit node, wherein a control terminal of the second transistor is coupled to the control node.

11. The circuit of claim 10 wherein the transistor and the second transistor become nonconductive in response to the ESD signal indicating an ESD event.

12. The circuit of claim 8 wherein the transistor becomes nonconductive in response to the ESD signal indicating an ESD event.

13. The circuit of claim 12 wherein the transistor becomes nonconductive in response to the detection signal indicating that the power supply voltage is absent.

14. The circuit of claim 7 wherein the at least one device includes a latch transistor that when made conductive in response to an ESD event, pulls the output signal to a power supply voltage of the second domain circuitry.

15. The circuit of claim 7 further comprising a combining circuit having a first input to receive the detection signal and a second input to receive the ESD signal, wherein the control node is coupled to the output of the combining circuit.

16. The circuit of claim 15 wherein the output of the combining circuit is connected to a bias transistor having a control terminal coupled to receive the ESD signal, wherein the transistor is made conductive to pull the output of the combing circuit to a power supply voltage terminal in response to the ESD signal indicating an ESD event.

17. The circuit of claim 7 wherein the ESD signal is indicative of an ESD event on a terminal of the integrated circuit receiving a power supply voltage for the second domain circuitry.

18. The circuit of claim 7 wherein the detection circuit is indicative that a power supply voltage of the first domain circuitry is absent.

19. The circuit of claim 7 wherein the first domain circuitry is characterized as digital circuitry and the second domain circuitry is characterized as analog circuitry.

20. The circuit of claim 7 wherein the level shift circuit is characterized as differential level shift circuit.

\* \* \* \* \*